(12) United States Patent
Minot

(10) Patent No.: US 8,818,767 B2
(45) Date of Patent: Aug. 26, 2014

(54) METHOD FOR ASSISTANCE WITH THE CONSTRUCTION AND VALIDATION OF AN AVIONICS PLATFORM

(75) Inventor: Frédéric Minot, Venerque (FR)

(73) Assignee: Airbus Operations S.A.S., Toulouse (FR)

( * ) Notice: Subject to any disclaimer, the term of this patent is extended or adjusted under 35 U.S.C. 154(b) by 480 days.

(21) Appl. No.: 12/781,273

(22) Filed: May 17, 2010

(65) Prior Publication Data

US 2010/0292979 A1    Nov. 18, 2010

(30) Foreign Application Priority Data

May 18, 2009  (FR) ...................................... 09 53267

(51) Int. Cl.
*G06F 17/50*   (2006.01)
*G06F 15/173*  (2006.01)

(52) U.S. Cl.
CPC .................................. *G06F 17/5095* (2013.01)
USPC .................................. 703/1; 703/13; 709/239

(58) Field of Classification Search
CPC .................................................. G06F 17/5095
USPC .......................... 703/1, 21, 13; 710/305; 701/3
See application file for complete search history.

(56) References Cited

U.S. PATENT DOCUMENTS

| | | | | |
|---|---|---|---|---|
| 6,002,347 | A * | 12/1999 | Daly et al. ..................... | 340/963 |
| 6,047,391 | A * | 4/2000 | Younis et al. ................. | 714/47.1 |
| 6,151,567 | A * | 11/2000 | Ames et al. ..................... | 703/13 |
| 6,178,391 | B1 * | 1/2001 | Anderson et al. ................. | 703/1 |
| 7,693,986 | B2 * | 4/2010 | Berbiguier et al. ........... | 709/224 |
| 7,756,145 | B2 * | 7/2010 | Kettering et al. .............. | 370/401 |
| 8,130,773 | B2 * | 3/2012 | Hall et al. ...................... | 370/401 |
| 8,151,024 | B2 * | 4/2012 | Nigoghosian et al. ........ | 710/104 |
| 8,311,782 | B2 * | 11/2012 | Minot .............................. | 703/2 |
| 8,332,504 | B2 * | 12/2012 | Ling et al. ...................... | 709/224 |
| 8,341,298 | B2 * | 12/2012 | Wilber et al. .................. | 709/249 |
| 8,423,331 | B2 * | 4/2013 | Minot .............................. | 703/2 |
| 2002/0144010 | A1 * | 10/2002 | Younis et al. .................. | 709/314 |

(Continued)

FOREIGN PATENT DOCUMENTS

| | | |
|---|---|---|
| DE | 10 2005 055 000 A1 | 5/2007 |
| EP | 1 739 010 A1 | 1/2007 |
| EP | 2 014 898 A2 | 1/2009 |

OTHER PUBLICATIONS

VMEbus Basics pp. 1-14, Date Unknown.*

(Continued)

*Primary Examiner* — Akash Saxena
(74) *Attorney, Agent, or Firm* — Oblon, Spivak, McClelland, Maier & Neustadt, L.L.P.

(57) ABSTRACT

A method for assisting the construction and validation of an avionics platform uses, on the one hand, a functional description of the platform using avionics functions, software modules suitable for executing these functions, and functional link occurrences between these modules and, on the other hand, a material description of this platform using calculation or communication items of equipment and physical links between these equipment. The method according to the invention enables to generate paths between the various items of equipment by using direct physical links and/or physical links belonging to one or more network(s), and subsequently to associate at least one such path to be each functional link occurrence. It also enables to associate to each software module an item of equipment adapted to host it.

11 Claims, 7 Drawing Sheets

(56) References Cited

U.S. PATENT DOCUMENTS

| | | | |
|---|---|---|---|
| 2004/0153830 A1* | 8/2004 | Cebula et al. | 714/38 |
| 2005/0065669 A1* | 3/2005 | Roux et al. | 701/3 |
| 2005/0220029 A1* | 10/2005 | Calluaud et al. | 370/241 |
| 2006/0215568 A1* | 9/2006 | Smith | 370/241 |
| 2006/0293805 A1* | 12/2006 | Garcia | 701/16 |
| 2007/0127521 A1* | 6/2007 | Sandell et al. | 370/466 |
| 2008/0091300 A1* | 4/2008 | Fletcher et al. | 700/245 |
| 2008/0155513 A1* | 6/2008 | Ling et al. | 717/135 |
| 2010/0153684 A1* | 6/2010 | Girlich | 712/29 |
| 2010/0306435 A1* | 12/2010 | Nigoghosian et al. | 710/301 |
| 2011/0010156 A1* | 1/2011 | Candia et al. | 703/13 |
| 2011/0015900 A1* | 1/2011 | Minot | 703/1 |
| 2011/0071709 A1* | 3/2011 | Damiani et al. | 701/3 |
| 2011/0235527 A1* | 9/2011 | Buse et al. | 370/242 |
| 2011/0296151 A1* | 12/2011 | Martinez | 713/1 |
| 2011/0296379 A1* | 12/2011 | McCready | 717/121 |
| 2012/0027022 A1* | 2/2012 | Birkedahl | 370/401 |
| 2012/0233359 A1* | 9/2012 | Einig et al. | 710/16 |

OTHER PUBLICATIONS

Open Integrated Modular Avionic (IMA): State of the Art and future Development Road Map at Airbus Deutschland, Henning Butz, pp. 1-10, Google Search. Publication Aug. 13, 2008.*

Conventional PCI, pp. 1-28, http://en.wikipedia.org/wiki/Conventional_PCI.*

Modeling and Simulation of Integrated Modular Avionics by Christian Fraboul & Frank Martin; pp. 102-108 IEEE 1998.*

U.S. Appl. No. 12/781,276, filed May 17, 2010, Minot.

U.S. Appl. No. 12/837,802, filed Jul. 16, 2010, Minot.

* cited by examiner

«METHOD FOR ASSISTANCE WITH THE CONSTRUCTION AND VALIDATION OF AN AVIONICS PLATFORM»

TECHNICAL FIELD

The present invention relates in a general manner to avionics platforms and more specifically to those manufactured according to integrated modular architecture, known as IMA (Integrated Modular Avionics).

STATE OF THE PRIOR ART

The manufacture of an avionics platform, i.e. of a set of on-board calculation and communication resources enabling the functions of an aircraft to be performed, conventionally rely on the use of dedicated computers and communication buses. In such a platform each function of the aircraft, hereafter called an avionics function, is implemented using computers having an architecture and inputs and outputs which are specific to the accomplishment of the function. This involves manufacturing, certifying and maintaining a large number of components, or LRUs (Line Replaceable Units), whenever a new type of equipment has to be designed.

In order to remedy this source of complexity and costs, new-generation avionics platforms use, as far as possible, an integrated modular architecture (IMA). In this type of architecture the avionics functions are implemented in shared resources, in practice in the form of software modules hosted by generic computers, using non-dedicated communication resources. Such a platform has many advantages in terms of reducing the quantity of computers, of the number of different types of computers, of the number of cables, etc., which ultimately produces a more favourable final mass and substantial gains in terms of maintenance and stock management.

However, although conventional avionics platforms were manufactured empirically, using rules based on experience, and proceeding with numerous back-and-forth loops between the design phase and validation phase, new-generation platforms require an entirely different approach, both due to their complexity and due to the sharing of resources between avionics functions, inherent to IMA architecture. For example, whereas concomitant material failures were previously avoided by using dedicated calculation and communication resources, IMA architecture does not enable this robustness to be intrinsically guaranteed. It is therefore necessary to distribute the software modules judiciously between the generic computers, and to ensure that the communication resources enable the exchanges between these modules to be guaranteed.

Reciprocally, for a given platform, it is important to check that all the initially planned avionics functions are implemented correctly.

A first aim of the present invention is consequently to provide a method and a tool for assisting the manufacture of an avionics platform using integrated modular architecture.

A second aim of the present invention is to propose a method for validating the implementation of a set of avionics functions by a given platform.

PRESENTATION OF THE INVENTION

The present invention is defined by a method for assisting the construction of an avionics platform intended to implement a set of avionics functions, where each avionics function (Function) comprises one or more software modules (SystemFunctionOc), where any two software modules are able to exchange messages using a link (FctLinkOc), known as a functional link occurrence, where said avionics platform also comprises items of equipment (EquipmentOc) linked to one another by means of unidirectional or bidirectional physical links (PhysicalLink) belonging to different types of network, paths (Path) enabling said items of equipment to be linked, where each path consists either of a single direct physical link between a source equipment and destination (or target) equipment, or of a first physical link between said source equipment and a first network node, a second physical link between said destination equipment and a second network node, and at least a third physical link between said first and second nodes (NetPath). According to this method, each software module has an item of equipment associated with it on which it is intended to be hosted, and each functional link occurrence is associated with at least one path intented to let pass through it the messages of this link, and a check is made for each item of equipment (m) that it has sufficient material resources ($\beta_n(\alpha_j)$) to enable execution of the software module or modules which is/are associated with it.

For each item of equipment, it is also possible to check whether the connection resources (CnxResource) of its connectors are sufficient to receive the paths (Path) associated with the functional links of the software modules which are associated with it.

The physical links can be of a first type ($1 \Rightarrow 1$) enabling an item of equipment to be linked in unidirectional fashion to one sole other item of equipment, or of a second type ($1 \Rightarrow N$) enabling an item of equipment to be linked in unidirectional fashion to several other items of equipment, of a third type ($1 \Leftrightarrow 1$) enabling two items of equipment to be linked in bidirectional fashion, or of a fourth type ($N \Leftrightarrow N$) enabling multiple items of equipment to be linked in bidirectional fashion.

Advantageously, each connector of an item of equipment has connection resources (CnxResource) associated with it, where each connection resource is capable of receiving a physical link (PhysicalLink) of the first, second, third or fourth type.

Preferably, for each source item of equipment, the types of physical links associated with the connection resources of the connectors of this item of equipment are listed, a type of link is selected from among the types of links listed in this fashion; the items of equipment having connection resources capable of receiving the type of link thus selected are then listed, and a selection is made of a destination equipment from among the items of equipment listed in this fashion.

It is possible to generate a path between the source equipment and the destination equipment by creating a new physical link of the said selected type between these two items of equipment, if the latter is of the first or third type, the generated path being then associated with the physical link created in this fashion, and being unidirectional in the case of the first type and bidirectional in the case of the third type.

It is possible alternatively to generate a path between the source equipment and the destination equipment by associating it with an existing physical link or by creating a new link of the said selected type between these two items of equipment, if said selected type is of the second or fourth type; the generated path being then associated with the existing or created link, and being unidirectional in the case of the second type and bidirectional in the case of the fourth type.

A check is advantageously made as to whether the connection resources of the connectors of the source equipment, on the one hand, and those of the connectors of the destination equipment, on the other, are sufficient to receive the new created physical links; in this case the generated path is validated, and if not it is invalidated.

The invention also concerns a tool for assisting the construction of an avionics platform comprising a first database in which is stored a functional description of the said platform, a second database in which is stored a material description of said platform, and a workstation linked to the first and second databases, where said workstation comprises means suitable to implement the steps of the method described above.

The functional description preferably comprises a list of the avionics functions and of the links between them, a list of the software modules enabling the avionics functions to be executed, and of the functional link occurrences between these modules. In a similar manner the material description comprises a list of calculation or communication equipment, together with a list of the physical links between these items of equipment.

BRIEF DESCRIPTION OF THE DRAWINGS

Other characteristics and advantages of the invention will become apparent on reading the preferential embodiments of the invention in reference to the attached figures, among which.

DETAILED DESCRIPTION OF SPECIFIC EMBODIMENTS

In this part we shall consider an avionics platform which is to be constructed using integrated modular architecture, as defined above. This platform is designed to implement a set of predetermined avionics functions. As an example, these avionics functions may be the control of the roll of the aircraft, the computation of the quantity of fuel, etc.

Each of these avionics functions, as a general rule, has a number of software modules associated with it which are designed to be hosted in on-board generic computers, each of which participates in performing the function. For safety reasons certain functions may be duplicated. The software modules of duplicated functions are not necessarily identical. For example, two such software modules may correspond to a command channel (COM) and a monitoring channel (MON) of a flight control system, and use different algorithms to accomplish the same function.

The software modules associated with the various avionics functions can exchange messages between one another via links known as "functional link occurrences", as will be seen hereafter. For example, a software module performing the function of roll control can send an alert message to a software module responsible for the display function.

All the avionics functions of an aircraft and their reciprocal relationships can, advantageously, be represented using object modelling.

Figure 1:
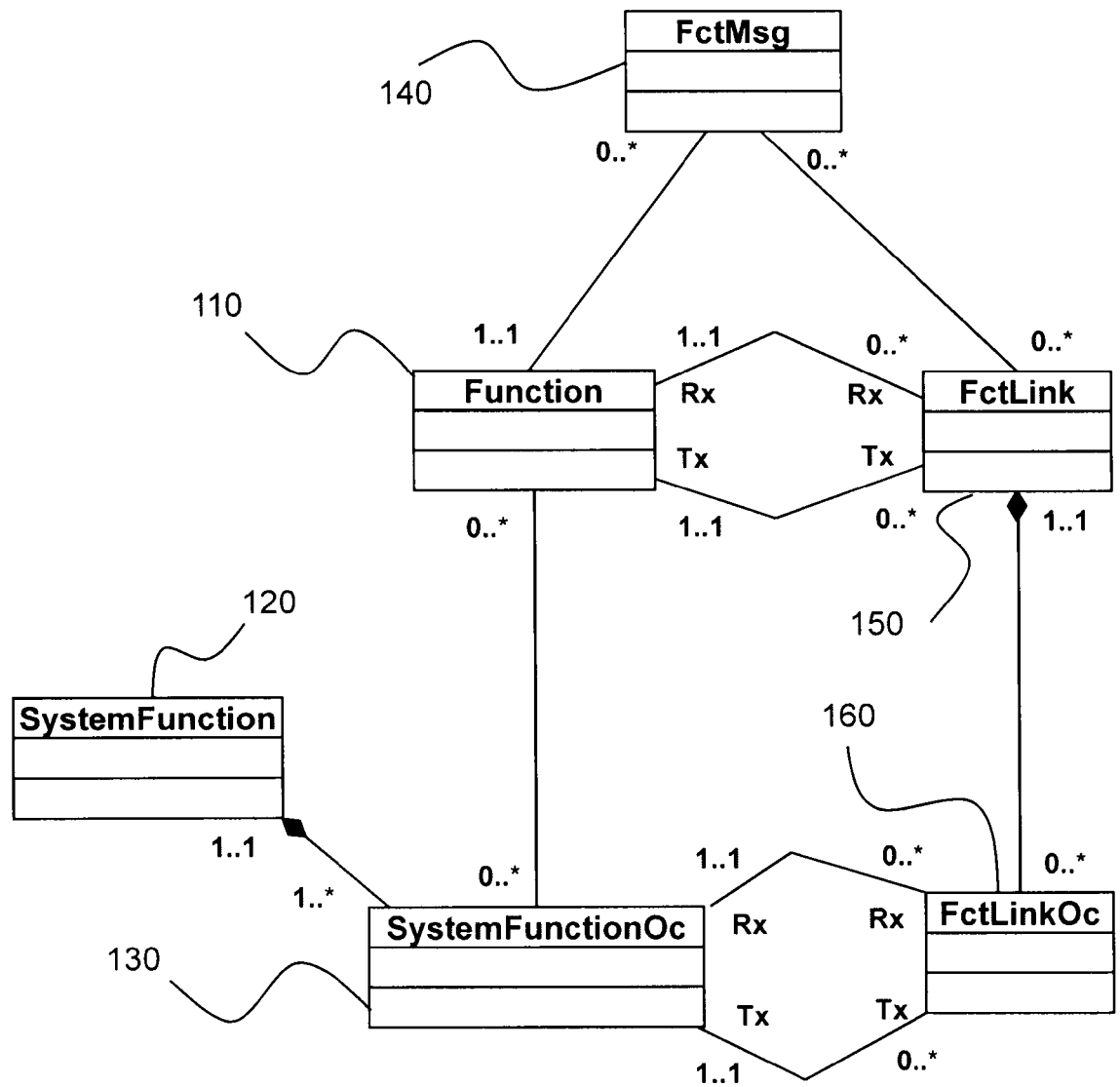
FIG. 1 gives an object-oriented schematic representation of the avionics functions of an aircraft.

FIG. 1 gives a UML (Unified Modelling Language) diagram modelling the data structure and the relationships between the avionics functions of an aircraft. A description of the UML language can be found, for example, in a work by F. Barbier entitled "UML2 et MDE" [UML and MDE] published by Dunod.

The represented model comprises the objects (or classes) called "Function", "SystemFunction", "SystemFunctionOc", "FctMsg", "FctLink" and "FctLinkOc". For reasons of simplification the attributes and methods relative to the different objects have been omitted where they did not appear to be necessary for the understanding of the invention.

The "Function" object, 110, is an avionics function. This object is associated with any number of "SystemFunctionOc" objects, 130, as explained below. A function can transmit any number of messages, using a symbolic link, called a functional link, to another function. Thus, the "Function" object, 110, is associated with 0 to N "Fctmsg" objects, 140. Each functional link, modelled by the "FctLink" object, 150, is associated with a transmitting avionics function and a receiving avionics function. Reciprocally, a function may have any number of incoming links, and any number of outgoing links, associated with it. In addition, a functional link may have any number of messages passing through it and, reciprocally, a message from an avionics function may be transmitted over any number of functional links.

Each functional link 150 can be instantiated, and consist of 0 to N functional link occurrences 160. The functional link occurrences designated by the "FctLinkOc" object.

The "SystemFunction" object, designated by 120, consists of at least one "SystemFunctionOc" occurrence, 130. Object 130 may be considered in practice to be a software module intended to be hosted by an item of equipment, in which case object 120 then represents a class of such software modules. Object 130 is associated with any number of input functional link occurrences, and any number of outgoing functional link occurrences. Reciprocally, a functional link occurrence is associated with a transmitting software module and a receiving software module.

The model represented in FIG. 1 advantageously enables the avionics platform functional representation to be stored in a first database, called hereafter the functional database.

Figure 2:
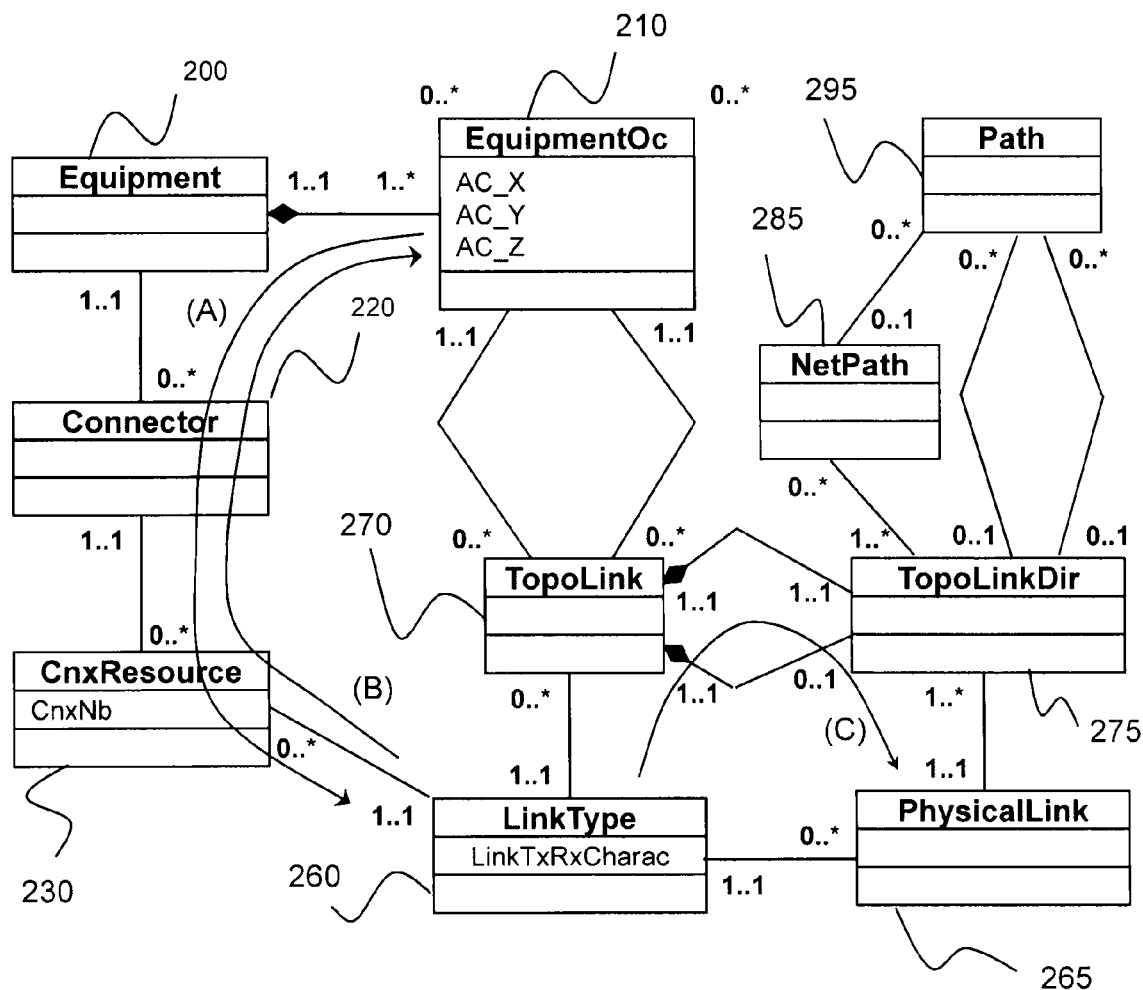
FIG. 2 gives an object-oriented schematic representation of an avionics platform.

The method according to the invention also uses a material (or equipment or hardware) representation of the avionics platform. FIG. 2 gives, in the form of a UML diagram, the data structure of this representation.

In the context of the present invention, the material structure of an avionics platform is generally described using objects called "Equipment", "EquipmentOc", "Connector", "CnxResource", "LinkType", "TopoLink", "TopoLinkDir", "NetPath", "Path", "Physical Link", defined hereafter.

The basic component of this material structure is the "Equipment" object, 200, which itself consists of one or more equipment occurrence(s), 210. In concrete terms, the "Equipment" object represents a class consisting of material elements such as computers, sensors, actuators, switching devices, routers, gateways, etc. More generally, an item of equipment can be considered to be a material element having calculation and/or communication resources. Each "Equipment" object can include one or more connectors, represented by object 220, which themselves consist of any number of connection resources, represented by object 230. In practice, these resources are physical ports onto which physical links can be connected.

Each equipment occurrence, 210, inherits attributes of the "Equipment" object, notably material resources, as we shall see below. It is also characterised by inherent attributes, notably its position in the aircraft, given here in Cartesian coordinates.

The "LinkType" object, 260, is also introduced, intended to represent the type of physical link of a communication support. This object has a "LinkTxRxChar" characteristic as an attribute, which gives the capacity of said link to link items of equipment to one another. More specifically, this characteristic may take the following values:

$1 \Rightarrow 1$: a directional link which can link a transmitting equipment occurrence to a single receiving equipment occurrence;

$1 \Rightarrow N$: a directional link which can link a transmitting equipment occurrence to multiple receiving equipment occurrences;

$1 \Leftrightarrow 1$: a bidirectional link which can link an equipment occurrence to a sole other equipment occurrence;

$N \Leftrightarrow N$: a bidirectional link which can link several equipment occurrences to one another, in both directions.

For example, a physical link of an AFDX (Avionics Full DupleX) network is of type $1 \Leftrightarrow 1$ (even if a multicast virtual link enables one terminal to be linked to multiple other terminals), a CAN (Controller Area Network) bus is of type $N \Leftrightarrow N$, a link in an ARINC 429 network is of type $1 \Rightarrow N$, a cable intended to link a digital (respectively analog) output of an item of equipment to multiple digital (respectively analog) equipment inputs is also of type $1 \Rightarrow N$. Depending on its characteristic, a type of link may be associated with one or more communication resources, 230, a connector, 220, belonging to an item of equipment, 210, or to no communication resource if this type of link is not supported by this item of equipment.

The "PhysicalLink" object, 265, represents the physical links, independently of the network to which they may belong. Each physical link has a single type of link, as defined above, associated with it.

The "TopoLink" object or topological link, 270, is an abstract entity indicating the possibility of connecting two equipment occurrences by means of a physical link, in unidirectional or bidirectional manner. Using this object a directional topological link, or "TopoLinkDir", 275, is defined, where each topological link consists either of one or of two directional topological links.

The "NetPath" object, 285, is also defined as an ordered and related list of directional topological links between communication network nodes. It is important to emphasise that the physical links underlying these directional topological links do not all necessarily belong to the same network. A network path includes at least one topological link and, conversely, a directional topological link may form part of any number of network paths, or of no network path if this link is isolated.

Finally, a more general object, known as a "Path" or topological path, 295, is defined, which can link any two equipment occurrences of the avionics platform. Such a path consists either of a directional topological link in either direction (in other words, the equipment occurrences are linked by a simple physical link), or of a network path to which is attached, at one or both of its two end(s), a directional topological link.

The model represented in FIG. 2 enables the avionics platform material representation to be stored in a second database, called hereafter the material database.

Figure 3A:
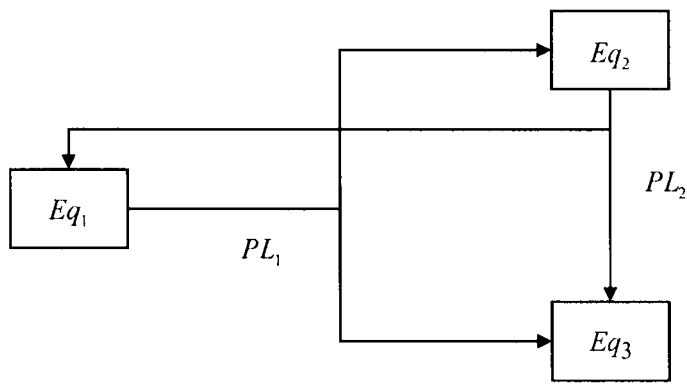
FIGS. 3A to 3C illustrate examples of physical links, topological links, network paths and topological paths in an avionics platform.
Figure 3B:
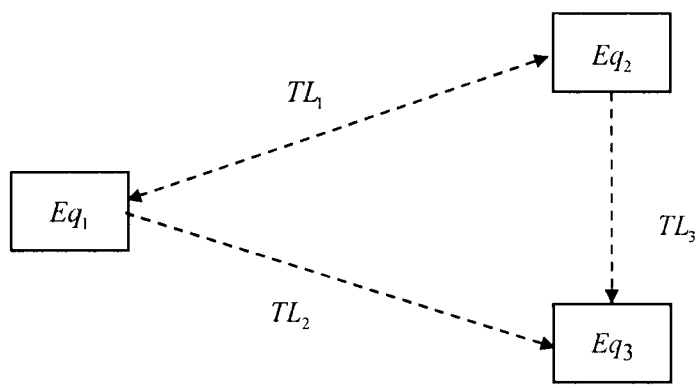
Figure 3C:
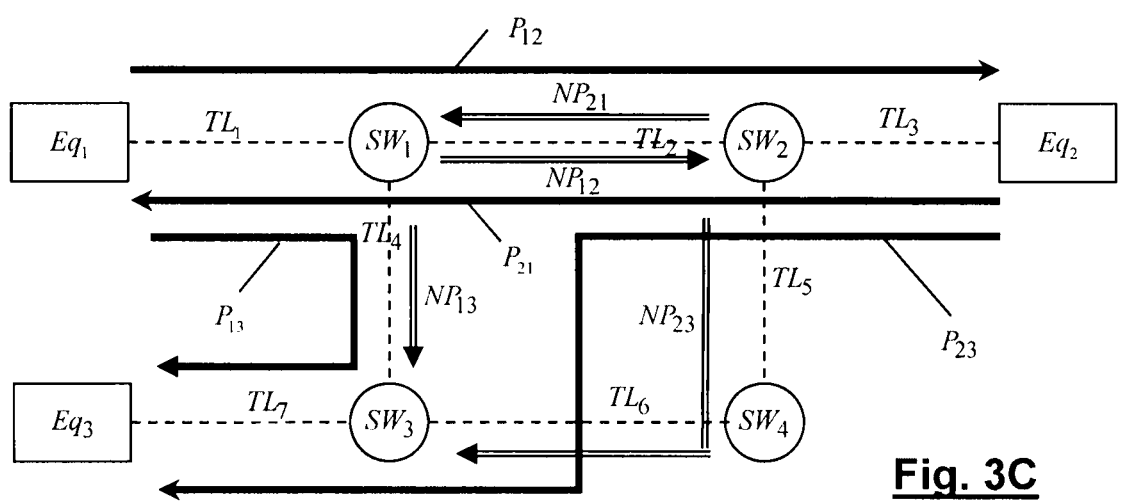

As an illustration, we have given in FIGS. 3A to 3C examples of physical links, of topological links, of network paths and of topological paths between different items of equipment.

In these figures three items of equipment have been represented (more rigorously, using object terminology, three equipment occurrences), $Eq_1$, $Eq_2$, $Eq_3$.

In FIG. 3A, item of equipment $Eq_1$ is linked to items of equipment $Eq_2$,$Eq_3$ using a first physical link $PL_1$ of type $1 \Rightarrow N$. Similarly, item of equipment $Eq_2$ is linked to items of equipment $Eq_1$,$Eq_3$, using a second physical link $PL_2$ also of type $1 \Rightarrow N$.

FIG. 3B represents the topological links $TL_1$, $TL_2$, $TL_3$ associated with the physical links of FIG. 3A. More specifically, topological link $TL_1$ between items of equipment $Eq_1$ and $Eq_2$ is associated with the physical links $PL_1$ and $PL_2$ between these two items of equipment. Topological link $TL_1$ in fact consists of a first directional topological link between $Eq_1$ and $Eq_2$, and a second directional topological link, in the opposite direction. Topological links $TL_2$ and $TL_3$ are associated respectively with physical links $PL_1$ and $PL_2$. Each consists of a single directional topological link.

FIG. 3C represents three items of equipment $Eq_1$,$Eq_2$,$Eq_3$ linked using an AFDX network including four switches $SW_1, \ldots, SW_4$. The various bidirectional topological links (type $1 \Leftrightarrow 1$ underlying physical links) have been designated $TL_1$ to $TL_7$, where each topological link $TL_1$ consists of two directional topological links $TL_1^+$ and $TL_1^-$ (the positive direction has been chosen here conventionally as clockwise). The network paths $NP_{12}$ $NP_{21}$, $NP_{13}$ and $NP_{23}$, defined respectively by $NP_{12}=\{TL_2^+\}$; $NP_{21}=\{TL_2^-\}$; $NP_{13}=\{TL_4^+\}$ and $NP_{23}=\{TL_5^+,TL_6^+\}$, have also been indicated. Topological path $P_{12}$ linking item of equipment $Eq_1$ to item of equipment $Eq_2$ is then constituted by $P_{12}=\{TL_1^+,NP_{12},TL_3^+\}$. Similarly, topological path $P_{21}$ linking item of equipment $Eq_2$ to item of equipment $Eq_1$ is constituted by $P_{21}\{TL_3^-,NP_{21},TL_1^-\}$. Topological path $P_{13}$, linking item of equipment $Eq_1$ to $Eq_3$, and path $P_{23}$, linking item of equipment $Eq_2$ to $Eq_3$, are constituted respectively by $P_{13}=\{TL_1^+,NP_{13},TL_7^+\}$ and $P_{23}=\{TL_3^-,NP_{23},TL_7^+\}$.

Figure 4:
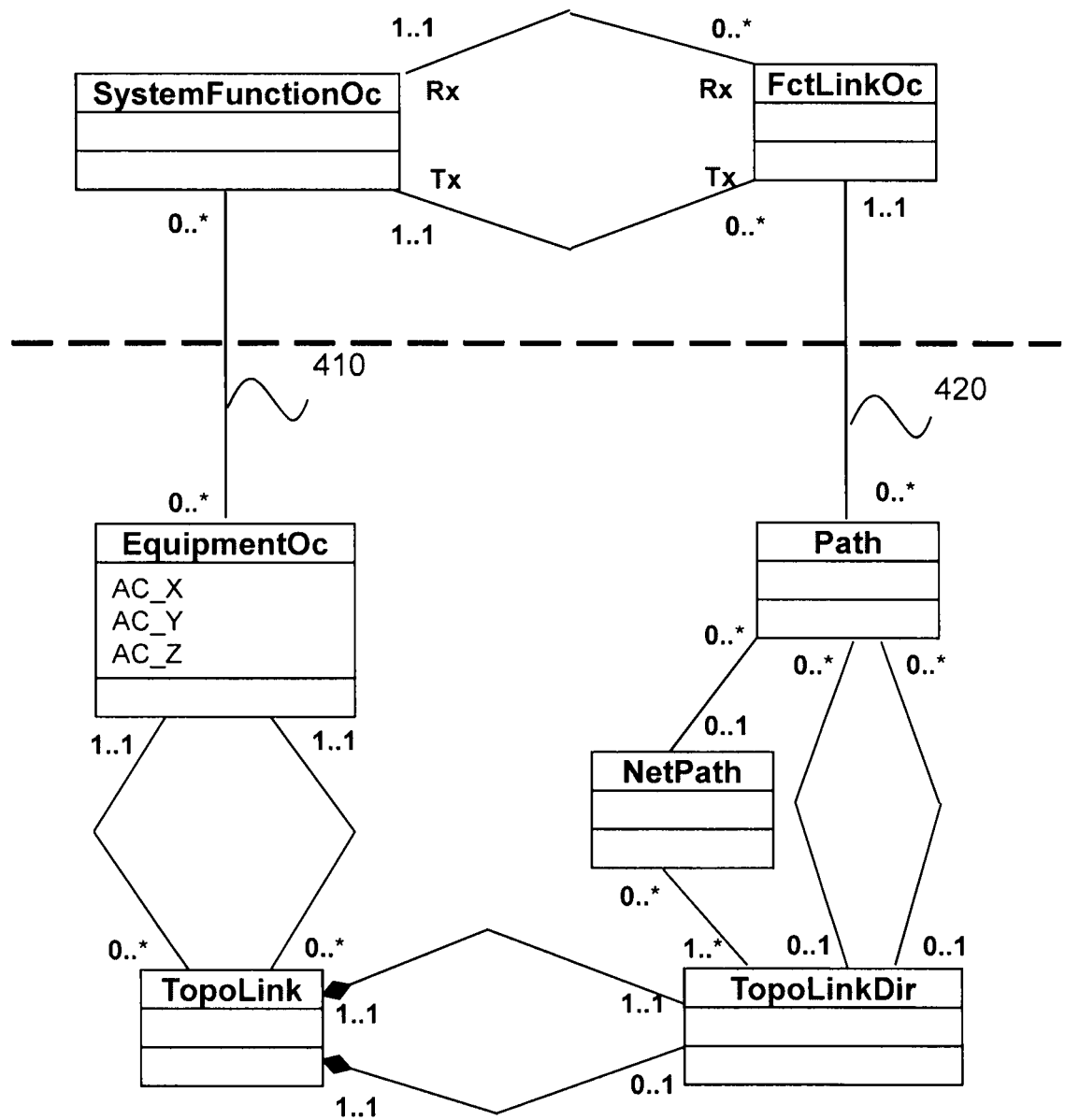
FIG. 4 illustrates schematically the correspondence between the avionics functions and the elements of the avionics platform, used in an embodiment of the invention.

FIG. 4 represents in a schematic manner the implementation of the avionics functions on the avionics platform.

This figure contains a part of the model of the platform's functional structure and a part of the model of its material structure, separated schematically by a dotted line. Construction of this platform consists in associating, firstly, with each "SystemFunctionOc" object, i.e. with each software module of an avionics function, an "EquipmentOc" equipment occurrence, intended to host it and, secondly, with every functional link "FctLinkOc" one or more path(s) intended to let pass through it(them) the functional messages between the software modules relative to the avionics functions.

This association operation is represented in the diagram by the associating relations 410 and 420.

Figure 5:
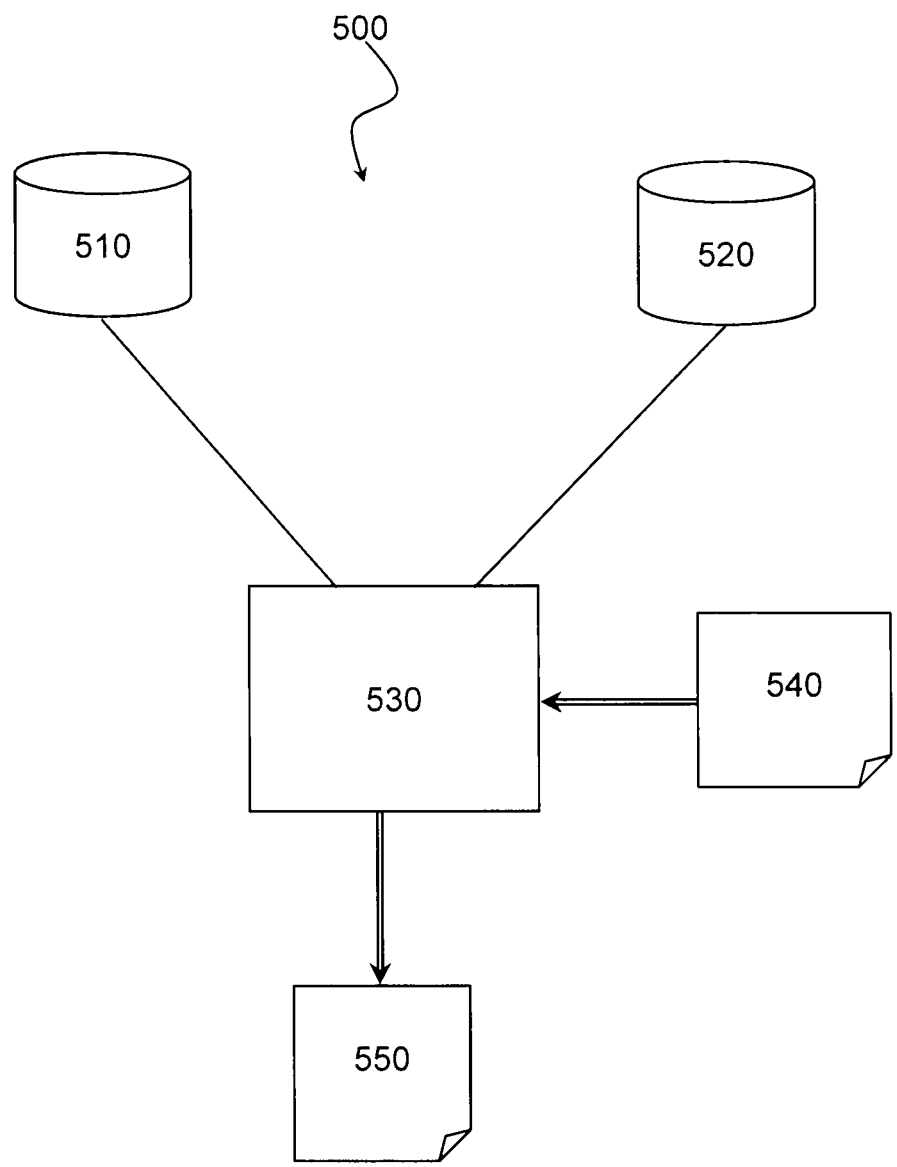
FIG. 5 illustrates schematically a tool for assisting the construction of the avionics platform according to an embodiment of the invention.

FIG. 5 represents schematically a tool for assisting the construction of the avionics platform according to an embodiment of the invention.

The tool in question, 500, comprises firstly the functional database, 510, the material database, 520, a workstation 530 and, if applicable, a constraints file 540. The purpose of the constraints file is to specify certain routing constraints of the functional links in the platform, in other words to prohibit or dictate certain topological paths. The workstation enables the abovementioned association operation to be undertaken, and outputs an implementation file, 550, attributing to each software module the equipment occurrence (the computer) which will host it, and for each functional link occurrence the topological path(s) which will support it.

The method of assisting the construction of the avionics platform makes certain checks during the association operation, enabling the choice of equipment occurrences and/or of topological paths to be guided.

Thus, to associate the software module with an equipment occurrence, a check is made that this equipment occurrence, for example a computer, does indeed have the quantities of material resources required for this module. A material resource is taken to mean here a hardware resource required by a software application for its storage and/or execution.

Figure 6:
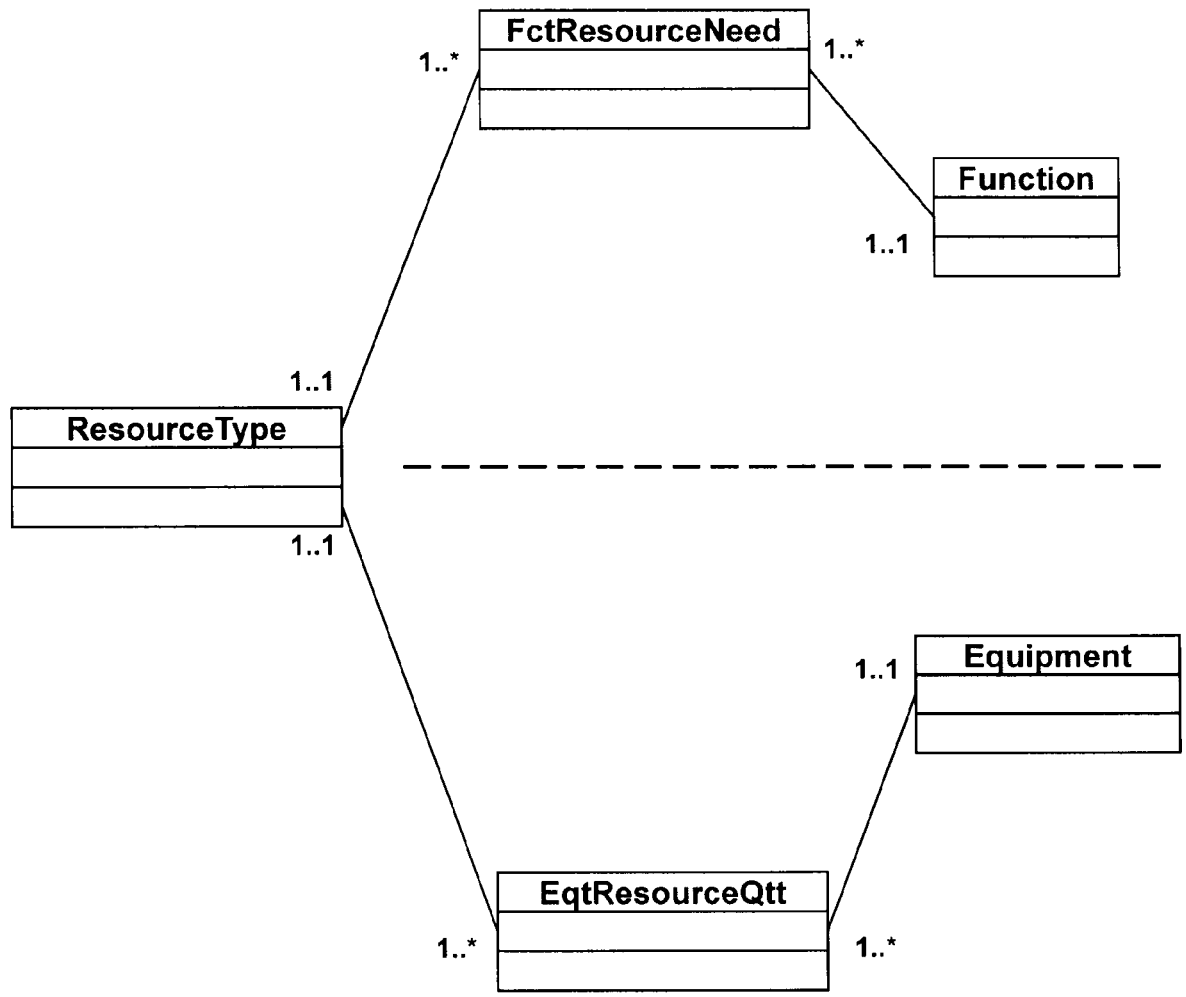
FIG. 6 is an object-oriented additional representation of the material resource requirements of the avionics functions, and of the quantities of material resources provided by the equipment of the avionics platform.

In FIG. 6 an addition to the representations in FIGS. 1 and 2 has been represented, enabling firstly the material resource requirements of the various avionics functions, and secondly the quantities of material resources provided by the various items of equipment, to be specified.

Each "Function" object is associated with one or more material resource requirement(s) "FctResourceNeed" of different types, which are necessary for the execution of the function, where the types of resources are modelled by the "ResourceType" object. For example, it is possible to cite as a resource type the computation capacity (number of elementary calculation operations per time unit), the quantity of RAM or ROM, or again the hard disk capacity, NVME (Non Volatile MEmory).

The quantities of material resources required for a function depend on those required by the software modules which implement it. More specifically, if the quantity of hardware resource $\alpha_j$ required by avionics function $f_i$ is noted $res(f_i, \alpha_j)$ and, similarly, the quantity of resource $\alpha_j$ required by the software module is noted $res(sm_k, \alpha_j)$ we have:

$$res(sm_k, \alpha_j) = \sum_{f_i \in \Omega_k} res(f_i, \alpha_j) \quad (1)$$

where $\Omega_k$ is the total set of avionics functions associated with software module $sm_k$ in the functional database.

Similarly, each "Equipment" object has a certain quantity of the material resources in question, or of some of them only, and this quantity is modelled by the "EqtResourceQtt" object. For example, an item of equipment may be characterised by its computation power, or its RAM, ROM or NVME size. We recall that each "EquipmentOc" equipment instance inherits attributes from the "Equipment" object and will therefore be characterised by the same material resources.

If the item of equipment occurrence m is intended to host one or more software module(s) $sm_k$, it will be necessary to check that its hardware resources enable the modules in question to be executed, namely:

$$\beta_m(\alpha_j) \geq \sum_{k \in \Lambda_m} res(sm_k, \alpha_j) \quad (2)$$

where $\beta_m(\alpha_j)$ is the quantity of hardware resource $\alpha_j$ available to equipment occurrence m and $\Lambda_m$ is the total set of software modules intended to be hosted by the latter.

According to an alternative embodiment of tool 500, for a given software module, it will be possible, for example, to offer a list of equipment occurrences of a given type (for example, a computer) able to host it, as a function of their respective remaining resources.

The method according to the invention enables to verify the consistency between the functional link and the topological path, in the sense defined above. More specifically, to ensure that a topological path is capable of conveying the messages of the functional link, a check is made that the software module transmitting the messages and the software module receiving these messages are indeed hosted by equipment occurrences (for example, computers), and that there is indeed a topological path linking these occurrences.

According to one embodiment, tool 500 may offer, for a given functional link between a first and second software module, all the possible topological paths enabling two equipment occurrences respectively hosting these modules to be linked. It will then be possible, using workstation 530, to select a topological path from among those proposed.

When all the functional links have been associated with topological paths and all the software modules have been associated with equipment occurrences on which they are intended to be hosted, the tool generates implementation file 550. The avionics platform is constructed in accordance with the associations specified in this file; in other words the software modules loaded in the various items of equipment (equipment occurrences) and the physical links of different types are made to link them.

Prior to the abovementioned association operation, tool 500 can provide assistance with the generation, firstly, of the physical links, of the links and of the topological paths between equipment occurrences and, secondly, of the functional link occurrences between software modules associated with various avionics functions.

Figure 7:
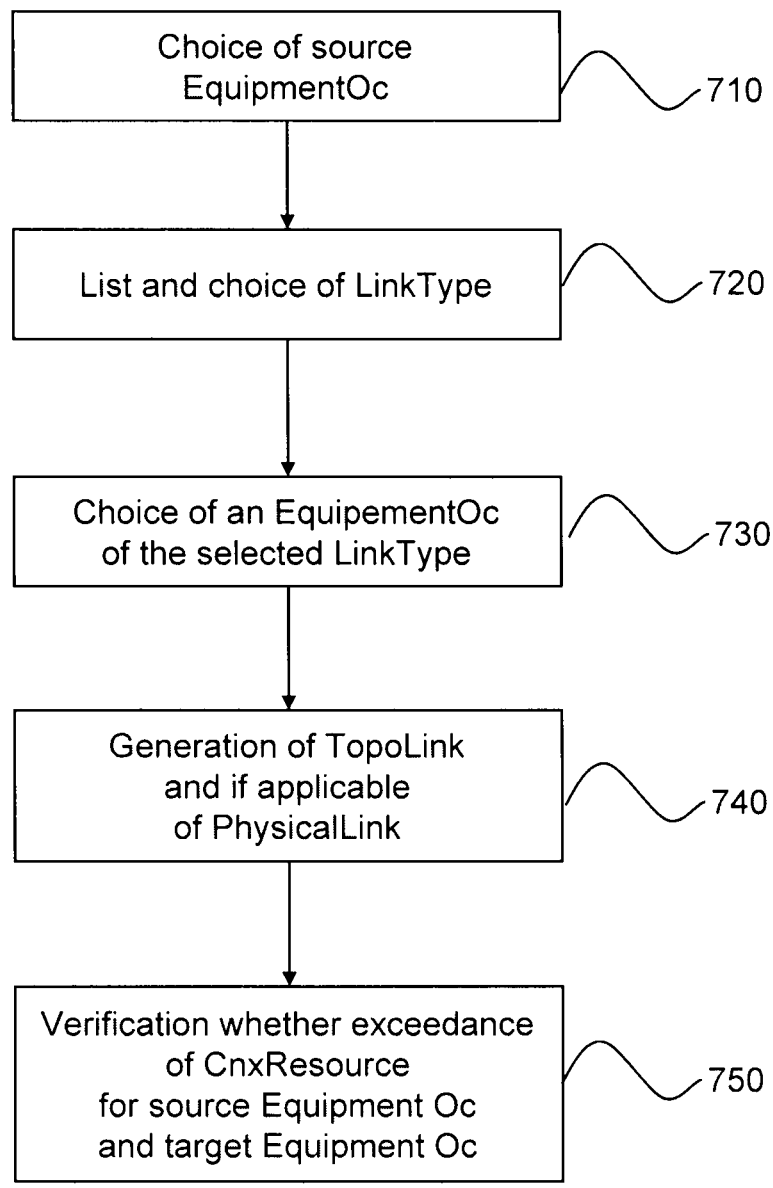
FIG. 7 represents schematically the generation of certain records in the material database of FIG. 5.

The topological links and, if applicable, the underlying physical links, are generated in five steps, as represented in FIG. 7.

In step 710 an equipment occurrence is chosen which will be the origin of the topological link.

In step 720, tool 500 automatically offers all the types of links supported by the item of equipment, through a communication resource "CnxResource" associated with one of its connectors (cf. arrow (A) in FIG. 2). A type of link in the proposed unit is then selected.

In step 730, tool 500 offers all the equipment occurrences originating from a given item of equipment, associated with the selected type through a connection resource of a connector of this item of equipment (cf. arrow (B) in FIG. 2). An equipment occurrence is selected from the proposed set which will be the destination of the topological path.

In step 740 an attempt is made to generate a topological link between the equipment occurrence of origin and the destination equipment occurrence.

To accomplish this a distinction is made according to the type of link selected in step 720:

If the type of link chosen is 1 ⇔ 1, the tool offers to create a new physical link of the chosen type; in other words to create a bidirectional topological link (cf. arrow (C) in FIG. 2) or, in an equivalent manner, two directional topological links;

If the type of link chosen is N ⇔ N, the tool offers either to create a new physical link of the chosen type, or to associate the topological link with an existing physical link, of the chosen type, linking both equipment occurrences;

If the type of link chosen is 1 ⇒ 1, the tool offers by default to create a physical link of the chosen type from the equipment occurrence of origin to the destination equipment occurrence. If applicable, the tool can also offer to create a second physical link in the other direction. In the first case the topological link is unidirectional (a single directional topological link), and in the second case it is bidirectional (two directional topological links);

If the type of link chosen is 1⇒N, the tool offers by default either to create a physical link of the chosen type in the direction from the equipment occurrence of origin to the destination equipment occurrence, or to associate the topological link with an existing physical link, of the chosen type, linking both equipment occurrences. If applicable, the tool can also offer to create a second physical link of the same type, in the other direction, i.e. to associate the topological link with an existing physical link of this type, also in the other direction, i.e. in the direction from the destination equipment occurrence towards the equipment occurrence of origin.

In step 750 a check is made that there are connectors in the equipment occurrences of origin and destination, such that any physical links which are created do not lead to the connection resources associated with these connectors being exceeded for the type of link chosen (attribute CnxNb in the "CnxResource" object). If there are no longer enough connection resources in the connectors, either in the equipment occurrence of origin, or in the destination equipment occurrence, generation of the topological link is invalidated. Conversely, if there are sufficient connection resources the list of connectors able to receive the topological link can be offered automatically.

Tool 500 thus enables topological links and underlying physical links to be generated between equipment occurrences.

Once the topological links have been created, tool 500 can automatically generate from these links network paths between communication nodes and the topological paths between equipment occurrences, if these paths cannot be reduced to a simple physical link (case of FIG. 7, previously described). It should be noted that the inclusion of constraints specified in file 540 may lead to certain network paths being dictated or prohibited (for example, segregation or colocation constraints).

Tool 500 also enables assistance to be provided with the construction of functional links between software modules associated with various avionics functions. For a link between two given avionics functions $f_i$ and $f_j$, the workstation displays a matrix of functional links one of the dimensions of which represents the software modules associated with function $f_i$, and the other dimension of which represents the software modules associated with function $f_j$. By default the matrix is full; in other words all the possible functional links are chosen. Some of these functional links can then be deleted by deselecting them in the matrix.

The invention claimed is:

1. A method for assisting the construction of an avionics platform, using a tool including:
   a first functional database in which is stored a functional description of the platform,
   a second material database in which is stored a material description of the platform, and
   a workstation, linked to the first and second databases,
   wherein said method is to implement a set of avionics functions, where each avionics function comprises one or more software modules, and where any two software modules can exchange messages based on a link, known as a functional link occurrence, and
   wherein said avionics platform includes:
      items of equipment linked together by unidirectional or bidirectional physical links belonging to different types of networks, and
      paths enabling linking of said equipment, where each path consists of one of the following:
         a single direct physical link between a source item of equipment and a destination item of equipment,
         a first physical link between said source item of equipment and a first network node,
         a second physical link between said destination item of equipment and a second network node, and
         at least a third physical link between said first and second nodes,
   the method comprising:
   associating each software module with an item of equipment onto which said software module is intended to be hosted;
   for each functional link occurrence, providing to the workstation a list of all possible topological paths enabling a first item of equipment and a second item of equipment respectively hosting corresponding software modules to be linked;
   receiving from the workstation a selection of one of the topological paths from the list;
   associating each functional link occurrence with a corresponding selected topological path to let pass through each functional link occurrence the messages of the functional link occurrence;
   checking each item of equipment as to whether each item of equipment has sufficient material resources to allow execution of the software module or modules associated therewith; and
   generating an implementation file listing all of the items of equipment and providing:
      for each software module, the item of equipment associated therewith, if each equipment has sufficient material resources as determined by the checking, and
      for each functional link occurrence over which two software modules exchange messages, the at least one path associated therewith.

2. The method for assisting the construction of an avionics platform according to claim 1, further comprising:
   checking for each item of equipment, as to whether the connection resources of connectors of each item of equipment are sufficient to receive the topological paths associated with the functional links of the software modules associated with each item of equipment.

3. The method for assisting the construction of an avionics platform according to claim 1, wherein the physical links are one of a first type enabling an item of equipment to be linked in unidirectional fashion to one sole other item of equipment, a second type enabling an item of equipment to be linked in unidirectional fashion to several other items of equipment, a third type enabling two items of equipment to be linked in bidirectional fashion, or a fourth type enabling multiple items of equipment to be linked in bidirectional fashion.

4. The method for assisting the construction of an avionics platform according to claim 3, further comprising:
   associating each connector of an item of equipment with connection resources, where each connection resource is capable of receiving a physical link of the first, second, third, or fourth type.

5. A method for assisting the construction of an avionics platform, using a tool including:
   a first functional database in which is stored a functional description of the said platform,
   a second material database in which is stored a material description of the said platform, and
   a workstation, linked to the first and second databases, wherein said method is to implement a set of avionics functions, where each avionics function comprises one or more software modules, and where any two software modules can exchange messages based on a link, known as a functional link occurrence, and wherein said avionics platform includes:
items of equipment linked together by unidirectional or bidirectional physical links belonging to different types of networks, and
paths enabling linking of said equipment, where each path consists of one of the following:
a single direct physical link between a source item of equipment and a destination item of equipment,
a first physical link between said source item of equipment and a first network node,
a second physical link between said destination item of equipment and a second network node, and
at least a third physical link between said first and second nodes, the method comprising:
associating each software module with an item of equipment onto which said software module is intended to be hosted;
for each functional link occurrence, providing to the workstation a list of all possible topological paths enabling a first item of equipment and a second item of equipment respectively hosting corresponding software modules to be linked;
receiving from the workstation a selection of one of the topological paths from the list;
associating each functional link occurrence with a corresponding selected topological path to let pass through each functional link occurrence the messages of the functional link occurrence;
checking each equipment as to whether each item of equipment has sufficient material resources to allow execution of the software module or modules which is/are associated with each item of equipment;
listing in a source list for each source item of equipment the types of physical links associated with the connection resources of the connectors of each source item of equipment,
selecting a type of link from among the types of links listed in each source list;
listing in a receiving list the items of equipment having connection resources capable of receiving the type of link thus selected; and
selecting a destination item of equipment from among the items of equipment listed in each receiving list.

6. The method for assisting the construction of an avionics platform according to claim 5, further comprising:
generating a path between the source item of equipment and the destination item of equipment by creating a new physical link of said selected type of link between these two items of equipment, if the latter is of the first or third type, the generated path being then associated with the physical link created in this fashion, and being unidirectional in the case of the first type and bidirectional in the case of the third type.

7. The method for assisting the construction of an avionics platform according to claim 5, further comprising:
generating a path between the source item of equipment and the destination item of equipment by associating it with an existing physical link or by creating a new link of said selected type between these two items of equipment, if said selected type is of the second or fourth type, the generated path being then associated with the existing or created link, and being unidirectional in the case of the second type and bidirectional in the case of the fourth type.

8. The method for assisting the construction of an avionics platform according to claim 6 or 7, further comprising:
checking as to whether the connection resources of the connectors of the source item of equipment, on the one hand, and those of the connectors of the destination item of equipment, on the other, are sufficient to receive the new created physical links;
validating the generated path if the connection resources are sufficient; and
invalidating the generated path if the connection resources are not sufficient.

9. The method for assisting the construction of an avionics platform according to claim 1, wherein if one or more of the material resources and connection resources are sufficient, then said avionics platform is implemented using these resources.

10. A tool for assisting the construction of an avionics platform, comprising:
a first database in which is stored a functional description of said avionics platform,
a second database in which is stored a material description of said avionics platform, and
a workstation linked to the first and second databases, where said workstation comprises a processor configured to implement the method according to claim 1.

11. The tool for assisting the construction of an avionics platform according to claim 10, wherein the functional description includes a list of the avionics functions and of the links between them, a list of the software modules enabling the avionics functions to be executed, and of the functional link occurrences between these software modules, and the material description includes a list of calculation or communication items of equipment, as well as a list of the physical links between the calculation or communication items of equipment.

* * * * *